United States Patent [15] 3,673,502

Swain [45] June 27, 1972

[54] VOLTAGE SENSING SWITCH

[72] Inventor: Charles Gardner Swain, Arlington, Mass.

[73] Assignee: Massachusetts Institute of Technology, Cambridge, Mass.

[22] Filed: May 10, 1971

[21] Appl. No.: 141,810

[52] U.S. Cl. ..............................328/146, 307/235, 328/196, 330/30 D, 330/69

[51] Int. Cl. ..........................................................H03k 5/20

[58] Field of Search ..................307/235, 291; 328/146, 196, 328/206; 330/30 D, 69

[56] References Cited

UNITED STATES PATENTS

| | | | |
|---|---|---|---|
| 2,796,468 | 6/1957 | McDonald | 330/69 |
| 3,144,564 | 8/1964 | Sikorra | 330/30 D X |
| 3,147,388 | 9/1964 | Clark | 307/291 X |
| 3,213,385 | 10/1965 | Sikorra | 330/30 D X |
| 3,535,554 | 10/1970 | Webb | 330/30 D X |
| 3,550,117 | 12/1970 | Smith | 330/30 D X |
| 886,006 | 5/1971 | Nichols | 330/30 D X |
| 3,600,607 | 8/1971 | Vatin | 330/30 D X |

*Primary Examiner*—Donald D. Forrer
*Assistant Examiner*—R. C. Woodbridge
*Attorney*—Thomas Cooch, Martin M. Santa and Robert Shaw

[57] ABSTRACT

An improved electronic switch for sensing a voltage applied to either an inverting or a noninverting input of one of two voltage amplifiers uses an alternating sweep voltage applied to one input of each amplifier and means for connecting the output of each amplifier to an input of the other amplifier so that switching of the output state of either amplifier suppresses switching of the other amplifier during any sweep voltage cycle; which one of the two amplifiers changes its output state during any cycle is determined by the polarity and magnitude of the voltage being sensed after a nearly constant time within each cycle.

8 Claims, 3 Drawing Figures

INVENTOR
CHARLES GARDNER SWAIN

BY Martin L. Austin
ATTORNEY

INVENTOR
CHARLES GARDNER SWAIN
BY
ATTORNEY

INVENTOR
CHARLES GARDNER SWAIN
BY [signature]
ATTORNEY

VOLTAGE SENSING SWITCH

The invention described herein was made in the course of work under a grant or award from the Department of Health, Education and Welfare.

This invention relates to an improved voltage-sensing switch that can be used for sensing small changes in voltage, resistance, capacitance, inductance, temperature, pressure or humidity, as a component of apparatus of the kind described in my U. S. Pat. No. 3,300,622 and 3,496,453, for indicating, measuring or recording such changes or for automatic control.

This electronic switch compares a variable voltage dependent on the quantity being sensed, hereafter called the signal voltage, with a reference voltage in successive, rapidly recurring alternating sweep-voltage cycles, basing its response on comparisons at corresponding times within each cycle, and it is sensitive to differences of less than 1 millivolt. This switch requires two voltage amplifiers. Which one of the amplifiers switches its output state in each cycle depends on the sign of the difference between signal and reference voltages at that time. As soon as either amplifier switches, its output modifies an input voltage of the other amplifier so as to suppress the switching of the other amplifier. In effect, there is a race in each cycle up to the moment when switching of one of the amplifiers occurs, and the outcome of this race determines which amplifier output will be stable in its switched state and which in its unswitched state until reset occurs. Both amplifiers are reset automatically to the same initial unswitched state when the polarity of the alternating sweep voltage reverses.

Prior art voltage-sensing switches used in said patents involved balanced pairs of the following kinds of bistable elements: silicon controlled switches, silicon controlled rectifiers, unijunction transistors, or tunnel diodes, with silicon controlled switches being preferred. However, silicon controlled switches are not highly uniform, are objectionably temperature sensitive and noisy, and suffer from sharp shifts of gate voltage when switching occurs. Furthermore, recognition of which silicon controlled switch has fired requires an unbalanced logic circuit, which likewise may be sensitive to temperature.

The primary object of this invention is to provide a voltage-sensing switch that can rapidly and repeatedly compare and register the sign of the difference of two voltages that differ by less than one millivolt with higher precision and accuracy and with lower sensitivity to variations in temperature and power supply voltage, original selection of components and aging than one based on any of the previously used bistable elements. It utilizes instead two voltage amplifiers, one and only one of which changes its output level during any given sweep cycle. The output from either of the amplifiers can be used to control indicating, measuring, recording, intermittent (on-off) control, phase control, and/or proportional control outputs, as described in my U. S. Pat. No. 3,496,453.

For a fuller understanding of the nature and objects of the invention, reference should be had to the following description taken in connection with the accompanying drawings, in which.

Figure 1:
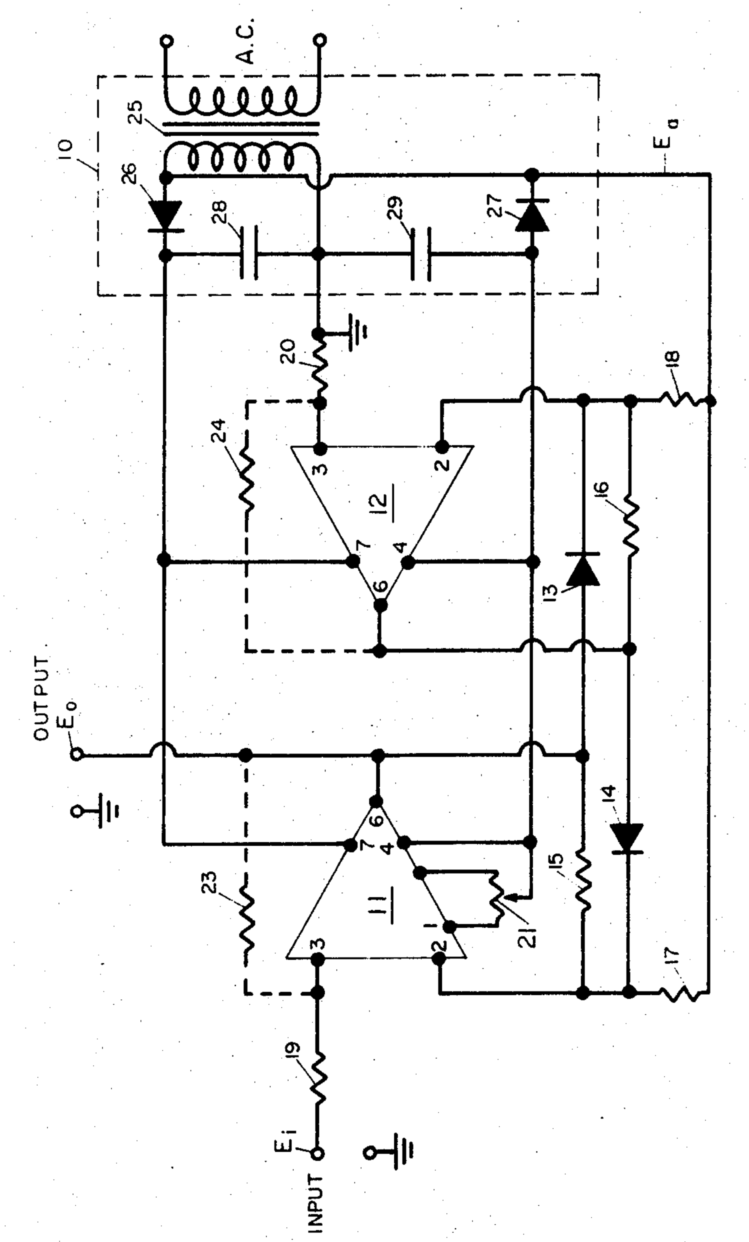
FIG. 1 is a schematic of a preferred embodiment using two linear integrated circuit operational amplifiers.

FIG. 1 illustrates an embodiment utilizing two operational amplifiers 11 and 12 as the two voltage amplifiers. Their terminals 1–7 are numbered in accord with the TO-99 package pin connections of 741 type operational amplifiers manufactured by more than a dozen companies in 1970: terminal 2 for inverting input, 3 for noninverting input, 4 for negative power supply, 1 and 5 for offset null adjustment, 6 for output, 7 for positive power supply.

The power supply 10 comprises transformer 25, diodes 26 and 27 and capacitors 28 and 29. It supplies positive voltage to each amplifier at 7, negative voltage to each amplifier at 4, and a sine wave sweep voltage $E_a$ applied through resistors 17 and 18 to each amplifier at its inverting input 2. The power supply common connection is also the common connection for signal input voltage $E_i$ and output $E_o$, and may be connected to chassis and earth ground.

FIG. 1 also illustrates the use of a diode as a means for connecting the output 6 of each amplifier to the inverting input 2 of the other amplifier for the suppressive interaction between the amplifiers. Thus if the output of amplifier 11 switches from negative to positive, diode 13 conducts and drives the inverting input of amplifier 12 positive to lock its output 6 at the initial unswitched negative level; similarly if amplifier 12 switches, diode 14 suppresses switching of amplifier 11. In any given cycle of the alternating sweep voltage $E_a$, which one of the amplifiers 11 and 12 switches depends on the input signal voltage $E_i$ being sensed, which is applied to only one of these amplifiers; the switched amplifier is reset to its previous unswitched condition when $E_a$ changes sign about 180° later in the cycle.

Negative feedback, provided by resistors 15 and 16, is helpful in promoting relatively uniform and reproducible behavior of 11 and 12, save for the desired differential effect due to the input signal $E_i$ applied to the noninverting input 3 of 11. Resistors 15–18 determine the voltage gains of the two amplifiers. Resistors 19–20 provides voltage drops due to bias current to match corresponding voltage drops across 17 and 18. Potentiometer 21 is a null or balance adjustment.

Suitable components are as follows: amplifiers 11 and 12, type 741 or 741C operational amplifiers; diodes 13 and 14, 1N4148; transformer 25, a 6.3 V. C. T. filament transformer, with only half of the secondary used; diodes 26 and 27, 1N5059; capacitors 28 and 29, 1 millifarad, 15V; resistors 15 and 16, 5 M ohm; resistors 17–20, 51K ohm wirewound or metal film; potentiometer 21, 10K ohm, 10-turn wirewound. The a.c. supply may be a power line, e.g., 115V. 60Hz.

In operation, the circuit is delicately balanced at a critical value of $E_i$. This is the value of $E_i$ at which amplifiers 11 and 12 have an equal probability of switching, or the value at which either one alone has an equal probability of switching vs. not switching, in any cycle of sweep voltage $E_a$. Applications of this voltage sensing switch will generally employ subsequent circuitry similar to kinds described in my U. S. Pat. No. 3,496,453, so that, at this value of $E_i$, a meter or recorder reads zero, or an indicator lamp is on the verge of turning on or off, or a servo control means is inactive or else is as likely in any cycle to make positive as negative net corrections to the system monitored by the source of $E_i$. Values of $E_i$ higher or more positive than this critical balance value then drive the output of such indicating or control devices in one direction, whereas lower or more negative values of $E_i$ drive them in the other direction. Depending on the application, one may desire this balance value to be zero or else equal to a particular reference voltage other than zero. The first step is to fix this balance value at the desired point. This can be done either by adjustment of potentiometer 21 or by connecting or incorporating a suitable reference voltage into the circuit, as follows. If it is desired to make the balance value zero, corresponding to zero or no reference voltage, the circuit can be balanced with a zero or shorted input by adjustment of potentiometer 21, which compensates for any difference of offset voltages of the two amplifiers. Obviously 21 could just as well be connected to 1 and 5 of amplifier 12 instead of amplifier 11. If 21 is omitted, balance will exist when $E_i$ is equal to this difference of offset voltages. Balance may be obtained for other small values of $E_i$ by adjustment of 21. If balance at a larger value of $E_i$ is desired, the appropriate reference voltage may be inserted in series with, but opposing, $E_i$ or alternatively the reference voltage may be inserted without polarity reversal in series with resistor 20.

When the signal voltage $E_i$ varies from the critical value at which the circuit is balanced, the voltage between inverting 2 and noninverting 3 inputs when neither diode 13 nor 14 is conducting is different for amplifier 11 than for amplifier 12 by the incremental voltage by which $E_i$ has varied. Depending on the polarity or sign of this change in voltage $E_t$, the voltage difference between the inverting input 2 and the noninverting input 3 of amplifier 11 becomes negative, during the negative-going sweep of $E_a$, earlier or later than that between 2 and 3 of amplifier 12. Whichever amplifier's differential input polarity changes first will cause it to initiate conduction through its output diode, thereby preventing the other amplifier from changing during that cycle. Thus the output voltage $E_o$ at terminal 6 of amplifier 11 approximates a square wave when the change in $E_t$ from the balance value has one polarity, but a constant voltage, except for transient momentary switching pulses, when the change in $E_t$ has the other polarity.

Positive feedback, provided by resistors 23 and 24, permits using larger input resistors than specified above and sensing of signal voltages $E_t$ from higher impedance sources, yet not so high as to require a field-effect transistor, electrometer tube or other comparably high-impedance amplifier in the first stage of the signal voltage amplifier. For example, use of six 510 K ohm metal film resistors for 15–20, 23 and 24 provides positive feedback in addition to negative feedback and gives good voltage sensitivity for switching, comparable to that with the 51 K ohm resistors specified earlier, in spite of ten-fold larger input resistors. Bootstrapping techniques may also be used to increase greatly the input impedance of a voltage amplifier. In general, an output voltage of the same polarity as the input voltage can be used to inject a current into the input circuit almost equal to the input current drawn by the amplifier, so that much less current has to be supplied by the signal driving source. For extremely low-current high-impedance signals, where even these techniques are inadequate, more powerful alternatives are described in later paragraphs.

Output voltage or current for controlling output devices can obviously be taken from either amplifier 11, as shown, or from amplifier 12, which will be in the opposite state from 11 whenever either has switched and not yet been reset. Either output may be summed or averaged over many cycles by a capacitor or operational amplifier integrator to give a smoother response for operation of meters, recorders or corrective controls which are responsive to frequencies approaching that of the sweep frequency. However, for heater control via a silicon controlled rectifier, triac, or power transistor, to maintain a constant temperature sensed by a thermistor, the unsmoothed output may be used. In fact it may sometimes be desirable actually to have more rather than less output jitter for applications requiring proportional control over a wider range of temperature, when the control provided by this circuit would otherwise be too precise, and this can be accomplished by introducing random noise at any amplifier input.

A dual operational amplifier can be used instead of two separate operational amplifiers, or amplifiers 11 and 12, diodes 13 and 14 and all resistors could be incorporated into a single integrated circuit.

When ripple on the power supply is not a problem, such as for battery operation, or for applications where comparisons and response need to be more frequent than 60 Hz, $E_a$ can be supplied by an oscillator operating at any desired frequency, e.g., 400 or 1,000 Hz. Furthermore a sawtooth wave or other form of alternating voltage may be used instead of a sine wave for $E_a$, even for 60 Hz.

Many alternative circuit arrangements are possible. For example, resistors 19 and 20 could be connected to terminals 2 of amplifiers 11, 12 instead of terminals 3 so that input signal $E_t$ and the reference voltage, ground potential in this case, would be connected to the inverting inputs of the amplifiers. In this event, the sweep voltage $E_a$ would be connected to the non-inverting inputs 3 of the amplifiers 11, 12 by transferring resistors 17, 18 from the inverting inputs 2 to the non-inverting inputs 3.

Figure 2:
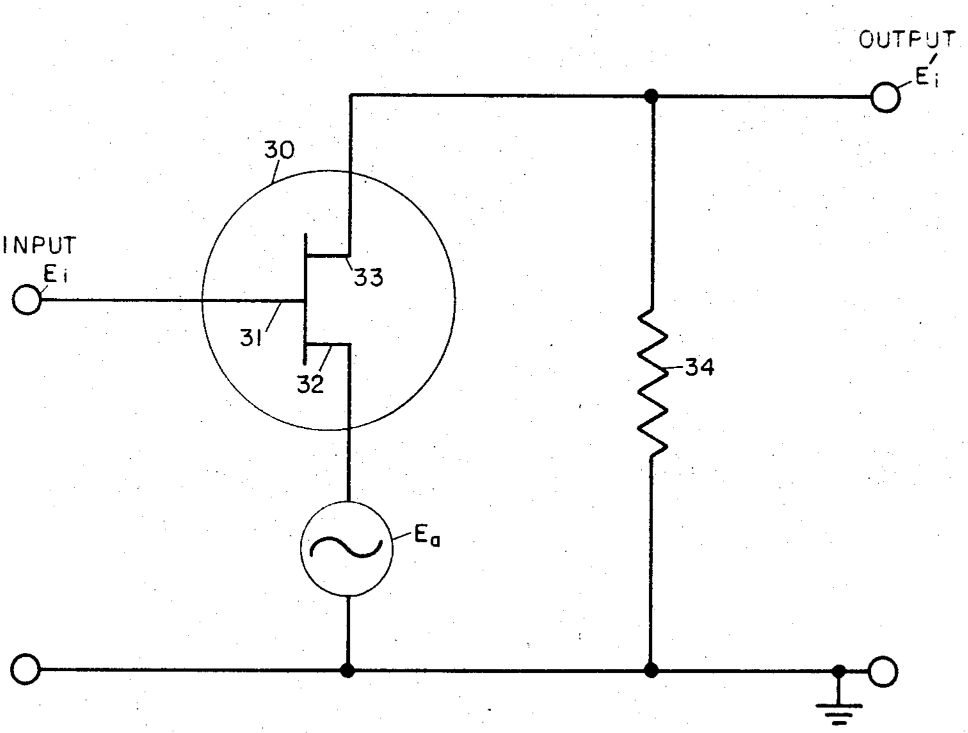
FIG. 2 is a schematic of an auxiliary circuit for matching high-impedance signal voltages.

Alternatively the same input of either amplifier may be used for applying both $E_t$ and $E_a$, and this can be either an inverting or a noninverting input. For example, $E_t$ may be used to increment or modify $E_a$ for one of the amplifiers. FIG. 2 is a schematic of a circuit for accomplishing this in a way that has advantages with especially low-current signals. A high-impedance signal voltage $E_t$ is applied to the gate 31 of a field-effect transistor 30 of either N-channel or P-channel type. This sweep voltage $E_a$ is applied to source terminal 32 of transistor 30. Bias voltages for gate and drain may be incorporated, but are not shown explicitly in FIG. 2. The current through the drain terminal 33 of 30 develops a voltage of $E_t'$ in passing through load resistor 34 that can be applied to one input of one of the two amplifiers while the other input of the same amplifier is connected to common or to a voltage intermediate between either 4 or 7 and common. With this addition, in order to maintain the drift-compensating advantages of parallel,differential circuitry, a reference voltage similar to $E_t'$ except independent of $E_t$ should be developed and applied (1) to the same input of the same amplifier in series opposition to $E_t$, or (2) as in a difference amplifier to the other input of the same amplifier to which $E_t'$ is applied, or (3) to the corresponding input of the other amplifier than the one to which $E_t'$ is applied.

For especially low-current, high-impedance signals $E_t$, an alternative to the appendages just described is to retain the circuit of FIG. 1, but use voltage amplifiers having much higher input impedance than type 741. For example, operational amplifiers utilizing pairs of field-effect transistors in their input stages may be used.

More complicated circuits are worthwhile for especially low-voltage $E_t$ signals. These can utilize the same basic invention described above, but differ in the detailed manner in which amplification is achieved. For example, for particularly low-voltage or accurate sensing, each amplifier may be a low-level, low-noise, low-drift differential D. C. amplifier, or an operational amplifier preceded by a low-level differential preamplifier. For example, Fairchild type 727 or 726 differential preamplifiers can be used to drive type 741 operational amplifiers, with negative feedback from the output of each 741 to the appropriate input of its own 727 or 726.

The means used to suppress switching of the other amplifier after either amplifier switches may also be varied. For example, if both diodes 13 and 14 have their polarities reversed, the switch will function in the same manner as described above, except that the sensing and decision will occur at a different point, shifted nearly 180°, during the positive-going sweep of the sine wave voltage $E_a$. Alternatively the output 6 of each amplifier can be connected to the inverting input 2 or the other amplifier by other means than a diode to suppress switching of the other amplifier. For example, either bipolar or field-effect transistors could be used instead, connected to conduct only in one direction or only when the sweep of $E_a$ is in one direction or only when $E_a$ has one polarity, so as to suppress switching of the other amplifier during any cycle after one amplifier switches, yet not prevent resetting when $E_a$ reverses. Another equivalent alternative would have the output of each amplifier connected by appropriate means to the noninverting input 3, instead of the inverting input 2, of the other amplifier; but for this connection the number of phase inversions must be increased or decreased by an odd number, e.g., by using inverting outputs of operational amplifiers, where they are available, or by inserting an extra inverting stage between each amplifier noninverting output 6 and its diode.

Figure 3:
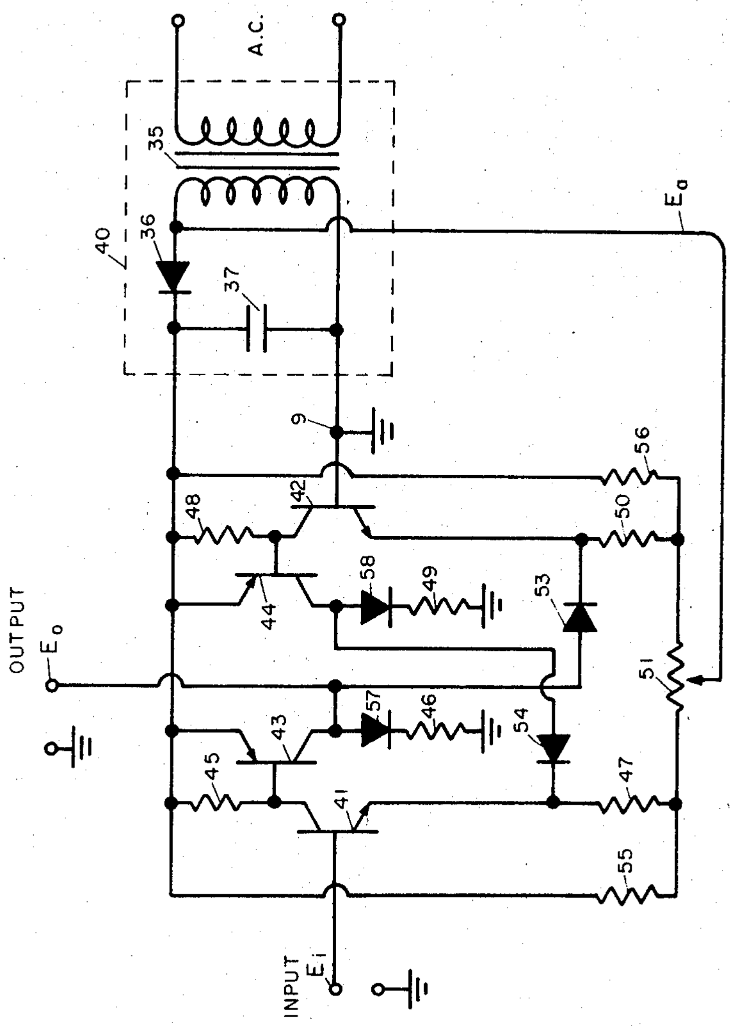
FIG. 3 is a schematic of another embodiment using simpler voltage amplifiers than operational amplifiers.

Although the high gain and feedback possibilities of the operational amplifiers used with FIG. 1 are most desirable to provide high sensitivity and stability, it is possible to use simpler voltage amplifiers if requirements for sensitivity and stability are less stringent. FIG. 3 represents an embodiment that is nearly the extreme of such simplification. Transformer 35, diode 36 and capacitor 37 comprise power supply 40; and the secondary of 35 also provides a sweep voltage $E_a$ of power-line frequency. Transistors 41, 43 and their associated bias and load resistors 45–47 taken together play the same role in this embodiment as the first voltage amplifier 11 in FIG. 1; transistors 42,44 and resistors 48–50 are similarly essentially equivalent to the second voltage amplifier 12 in FIG. 1. The bases of 41 and 42 are noninverting inputs, the emitter terminals of 41 and 42 are inverting inputs, and the collector terminals of 43 and 44 are outputs for the two amplifiers. Diodes 53 and 54 serve the same function of suppressing switching as 13 and 14 in FIG. 1. Potentiometer 51 in conjunction with resistors 55 and 56 provides a balance adjustment in a slightly different manner than that provided by 21 in FIG. 1. Diodes 57 and 58 prevent leakage from ground through diodes 53 or 54, which might otherwise delay switching. The operation is the same as described under FIG. 1. The most striking difference in the two circuits is the fact that FIG. 3 involves only 4 transistors and 9 resistors whereas FIG. 1 involves 40 transistors and 29 resistors, if assembled with type 741 operational amplifiers which contain 20 transistors and 11 resistors each. It thus operates with many fewer components than FIG. 1 if one counts each transistor and resistor as a separate component.

In both FIG. 1 and FIG. 3, the power supplies are made very simple to emphasize two significant advantages of this whole voltage-sensing method over all-d.c. circuits. The first advantage is tolerance to drift. Line and load regulation of the power supply do not have to be as precise in this time race because the alternating $E_a$ will still sweep through a switching point and be balanced for the same value of $E_i$ even if bias or offset voltages of both amplifiers drift together by the same amount with power supply voltage changes from changing line voltage or load by an amount that would have saturated all outputs and thereby desensitized a differential d.c. amplifier. Similarly drifts due to temperature changes or aging can be so large that they would saturate the outputs of either or both amplifiers if used without a sweep voltage, but again have negligible effect in a time-race circuit, provided only that the amplifiers are practically identical so that their drifts are practically equal. The frequency of required rebalancing is thereby reduced.

The second advantage is tolerance to 60 Hz pickup. This time-race approach reduces sensitivity toward 60 Hz electrostatic and electromagnetic pickup of all kinds, including a.c. ripple in the power supply. In all-d.c. circuit such a.c. pickup may obscure submillivolt changes in $E_i$ by saturating the high-gain amplifiers and output at the extremities of each cycle. On the other hand, in the present approach, sensing occurs and suppression is applied all within a very brief interval of time, about a microsecond, after very nearly the same elapsed time or phase angle into each cycle, so that any disturbance due to 60 Hz a.c. is nearly constant, not requiring averaging of the possibly wide and variable range of differences between $E_i$ and reference voltage throughout the cycle as the magnitude of pickup oscillates with line voltage. The phase angle at which sensing occurs can be varied by conventional procedures to coincide with an a.c. zero crossing to minimize effects from a.c. pickup, including body and proximity effects that operate by modifying each pickup. The time-race approach can therefore eliminate or greatly reduce requirements for shielding signal leads and filtering to exclude 60 Hz a.c.

What is claimed is:

1. A voltage-sensing switching circuit comprising:

two voltage amplifiers each with an inverting and a noninverting input;

a source of alternating voltage applied to one input of each amplifier;

means for applying the d.c. voltage input signal being sensed to one input of one amplifier;

means for applying other d.c. potentials to the remaining inputs of the amplifiers;

means for each amplifier connected between its output and an input of the other amplifier to suppress the switching of the other amplifier in any alternating voltage cycle after the amplifier switches its output state, and continuing to suppress until the switched amplifier is switched back to its original state by said alternating voltage.

2. The apparatus of claim 1 comprising in addition means for balancing said amplifier to cause the output of a selected one of said amplifiers to be on the verge of switching its output state in response to said alternating voltage when said sensed voltage has a particular value.

3. The apparatus of claim 1 wherein one of said d.c. potentials is a reference potential applied to another input than the one to which the d.c. voltage input signal being sensed is applied.

4. The apparatus of claim 1 wherein said voltage amplifiers are operational amplifiers.

5. The apparatus of claim 1 having a diode with its anode connected to the amplifier output and its cathode to the inverting input of the other amplifier as said means to suppress switching.

6. The apparatus of claim 1 having a diode with its cathode connected to the amplifier output and its anode to the inverting input of the other amplifier as said means to suppress switching.

7. The apparatus of claim 1 comprising in addition means for providing negative feedback to each amplifier by connecting a resistor from the output of each amplifier to its inverting input.

8. The apparatus of claim 7 comprising in addition means for providing positive feedback to each amplifier by connecting a resistor from the output of each amplifier to its noninverting input.

* * * * *